United States Patent
Lonergan et al.

(10) Patent No.: US 7,902,744 B2
(45) Date of Patent: Mar. 8, 2011

(54) HETEROIONIC JUNCTION LIGHT EMITTING ELECTROCHEMICAL CELL

(75) Inventors: Mark C. Lonergan, Eugene, OR (US); Calvin H. W. Cheng, Cincinnati, OH (US); Dean H. Johnston, Westerville, OH (US)

(73) Assignee: The State of Oregon Acting by and through the State Board of Higher Education on Behalf of the University of Oregon, Eugene, OR (US)

( * ) Notice: Subject to any disclaimer, the term of this patent is extended or adjusted under 35 U.S.C. 154(b) by 732 days.

(21) Appl. No.: 12/002,330

(22) Filed: Dec. 13, 2007

(65) Prior Publication Data

US 2008/0157662 A1    Jul. 3, 2008

Related U.S. Application Data

(63) Continuation-in-part of application No. 11/820,861, filed on Jun. 20, 2007, now abandoned.

(60) Provisional application No. 60/815,542, filed on Jun. 20, 2006.

(51) Int. Cl.
*H01J 1/62* (2006.01)
*H01J 63/04* (2006.01)

(52) U.S. Cl. .......... 313/504; 313/506; 313/505; 313/483
(58) Field of Classification Search .................. None
See application file for complete search history.

(56) References Cited

PUBLICATIONS

Cheng et al. "Unidirectional Current in a Polyacetylene Hetero-ionic Junction." J. Am. Chem. Soc., 126 (28), 8666-8667, 2004.

*Primary Examiner* — Peter J Macchiarolo
*Assistant Examiner* — Natalie K Walford
(74) *Attorney, Agent, or Firm* — Lumen Patent Firm

(57) ABSTRACT

A structure for high performance light emitting electrochemical cells comprises at least two active layers of mixed ionic/electronic conducting materials, at least one of which is electroluminescent. The active layers are sandwiched between ion blocking electrodes, typically metal and/or transparent conducting oxide, that are electrically but not ionically conductive. Application of bias to the electrodes results in the polarization of ions at the electrodes thereby generating a field to drive the injection of electronic carriers into the active layer. The injected electron and holes recombine within the active layers to emit light. The ability to balance electron and hole injection in the design of such devices provides for optimal light emission efficiency.

13 Claims, 7 Drawing Sheets

| 504 First ion blocking electrode, being electrically conductive but not ionically conductive |
|---|
| 500 First mixed ionic/electronic conducting material, being single ion conductor and electroluminescent |
| 502 Second mixed ionic/electronic conducting material, being single ion conductor |
| 506 Second ion blocking electrode, being electrically conductive but not ionically conductive |

| 604 First ion blocking electrode, being electrically conductive but not ionically conductive |
|---|
| 600 First mixed ionic/electronic conducting material, being conjugated ionomer, single ion conductor with ionic functional group and electroluminescent |
| 602 Second mixed ionic/electronic conducting material, being conjugated ionomer, single ion conductor distinct from first with ionic functional group oppositely charged from first |
| 606 Second ion blocking electrode, being electrically conductive but not ionically conductive |

| 704 First ion blocking electrode, being electrically conductive but not ionically conductive |
|---|
| 700 First mixed ionic/electronic conducting material, being conjugated ionomer, single ion conductor with ionic functional group and electroluminescent |
| 702 Second mixed ionic/electronic conducting material, being conjugated ionomer, single ion conductor distinct from first with ionic functional group distinct from first with same charge as first but different ion charge density |
| 706 Second ion blocking electrode, being electrically conductive but not ionically conductive |

| 804 First ion blocking electrode, being electrically conductive but not ionically conductive |
|---|
| 800 First mixed ionic/electronic conducting material, being nonionically functionalized conjugated polymer and non-conjugated polyelectrolyte, single ion conductor and electroluminescent |
| 802 Second mixed ionic/electronic conducting material, being nonionically functionalized conjugated polymer and non-conjugated polyelectrolyte with opposite charge as first, single ion conductor distinct from first |
| 806 Second ion blocking electrode, being electrically conductive but not ionically conductive |

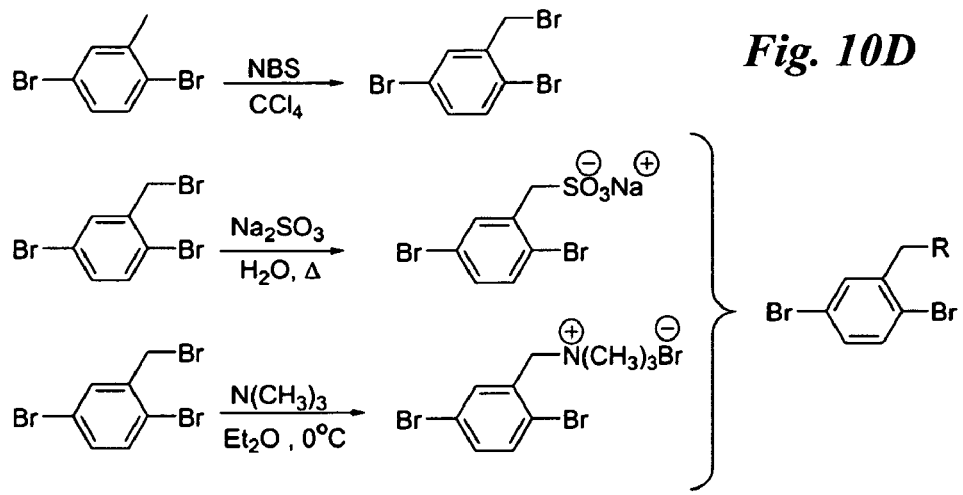
*Fig. 10D*
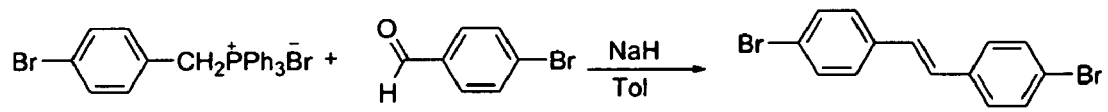
*Fig. 10E*
*Fig. 10F*
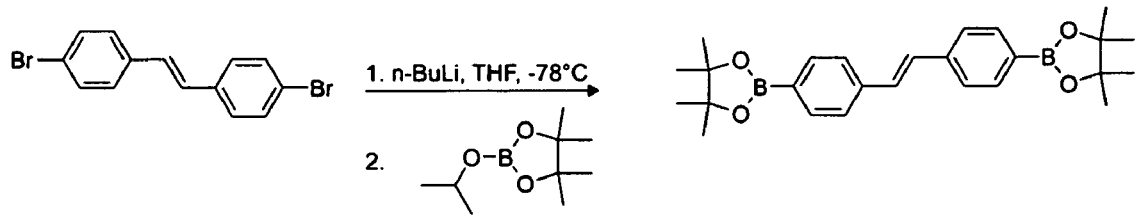

HETEROIONIC JUNCTION LIGHT EMITTING ELECTROCHEMICAL CELL

CROSS-REFERENCE TO RELATED APPLICATIONS

This application is a continuation-in-part of U.S. patent application Ser. No. 11/820,861 filed Jun. 20, 2007, now abandoned which claims priority from U.S. provisional patent application No. 60/815,542 filed Jun. 20, 2006, both of which are incorporated herein by reference.

STATEMENT OF GOVERNMENT SPONSORED SUPPORT

This invention was made with Government support under Grant No. DMR 0210078 awarded by the NSF. The US Government has certain rights in this invention.

FIELD OF THE INVENTION

The present invention relates generally to light-emitting devices and materials. More specifically, it relates to improved polymer light emitting electrochemical cells.

BACKGROUND OF THE INVENTION

A conventional polymer light-emitting electrochemical cell (PLEC) is composed of a mixture of a luminescent polymer and a polymer salt complex. The mixture is positioned between two electrodes, at least one of which is transparent (e.g., indium tin oxide, ITO). The application of a voltage bias to the electrodes causes polarization of ions against the electrodes. Induced electric fields at the electrode interfaces drives charge injection. Recombination of electrons and holes in the luminescent polymer generates light. Current PLEC devices, however, suffer from various limitations including energy inefficiency and instability of the materials due to degradative over-oxidation or over-reduction of the active polymer. In particular, the most common PLECs are based on conjugated polymers blended with a polymer-salt complex. These materials are not suitable because they contain free salt. Consequently, ambipolar diffusion of neutral anion-cation pairs will destroy any differential in ion content between contacted materials.

SUMMARY OF THE INVENTION

The inventors have discovered materials and structures for PLEC devices which provide material stability and high efficiency through precisely balanced electron and hole injection. The PLECs of the present invention employ a heteroionic junction composed of two layers of conjugated ionomers each with differing ion content. Through the application of principles of double layer capacitance engineering, the relative ion content of the two layers is used to control the relative potential between the anode and the cathode, thereby increasing efficiency and decreasing drive voltage. The use of luminescent conjugated ionomers with varied ionic functional group density reduces the susceptibility to degradative over-oxidation or over-reduction of the active polymer.

In one aspect, a light emitting electrochemical cell comprises at least two layers of mixed ionic/electronic conducting materials at least one of which is electroluminescent. These layers of mixed ionic/electronic conducting materials are henceforth referred to as the active layers. These active layers are distinct single ion conductors, joined to form a heteroionic junction. The active layers are sandwiched between ion-blocking electrodes, typically metal and/or transparent conducting oxide, that are electrically but not ionically conductive. These electrodes contact the active layers. Application of bias to the electrodes results in the polarization of ions at the blocking electrodes thereby generating a field to drive the injection of electronic carriers into the active layer (electrons injected at one blocking electrode and holes at the other depending on the sign of bias). The injected electron and holes recombine within the active layers to emit light.

In one embodiment, each of the active layers is composed of a conjugated ionomer having an ionic functional group. In one variant, the ionic functional groups in the two layers have different charge signs. In another variant, the ionic functional groups have the same sign, but the layers have different ion charge densities.

In another embodiment, each of the active layers is composed of a mixture of a nonionically functionalized conjugated polymer and a non-conjugated polyelectrolyte, where the two layers have oppositely charged polyelectrolytes.

The two-layer heteroionic junction structure allows for the potential drops at the two ion blocking electrodes to be separately engineered. This permits for the fields driving electron and hole injection into the light emitting materials to be separately engineered and hence precisely balanced through control of ion composition. The ability to balance electron and hole injection provides for optimal light emission efficiency. Thus, the devices are preferably characterized in that electroluminescence of the device is optimized with respect to changes in ion concentrations in the active layers.

The heteroionic junction structure also provides material stability due to ionic isolation of the two layers from each other, i.e., the ionic species in the active layers do not experience bulk interdiffusion. More specifically, the diffusion coefficients of the ionic species differ by at least an order of magnitude.

BRIEF DESCRIPTION OF THE DRAWINGS

FIG. 5 is a schematic illustration of a heteroionic junction light emitting electrochemical cell device according to an embodiment of the invention.

FIG. 6 shows a schematic of a heteroionic junction light emitting electrochemical cell in which the ionic functional groups of the conjugated polymers composing the active layers have opposite charges, according to an embodiment of the invention FIG. 7 shows a schematic of a heteroionic junction light emitting electrochemical cell in which the ionic functional groups of the conjugated polymers composing the active layers have the same charge but different ion charge densities, according to an embodiment of the invention.

FIG. 8 schematically illustrates a heteroionic junction light emitting electrochemical cell in which the active layers are composed of nonionically functionalized conjugated polymers and oppositely charged non-conjugated polyelectrolytes with opposite charges.

FIGS. 10D-F illustrate the synthesis of monomers which may be used in embodiments of the present invention.

DETAILED DESCRIPTION

Embodiments of the present invention are based on a two-layer heteroionic structure designed using principles of double layer capacitance engineering to control of the ion content in the active layers so as to balance electron and hole injection, thereby increasing the efficiency of the device. The concept of double layer capacitance engineering ($C_{dl}E$) relies on the unique properties of mixed ionic/electronic conductors (MIECs) interfaced to ion blocking electrodes. The capacitance per unit area ($C_{dl}$) due to the polarization of ions at a blocking electrode is given, in the zero bias Guoy-Chapman limit, by:

$$C_{dl} = \sqrt{\frac{2z^2 e^2 \varepsilon n}{k_B T}} \quad (1)$$

where e is the elementary charge, ze is the magnitude of the charge on the ions, n is the free ion concentration, $\varepsilon$ is the dielectric constant, $k_B$ is the Boltzmann constant, and T is the temperature. It is important to note that, in general, $C_{dl}$ does depend on applied bias.

The most important aspect of eq. (1) is that $C_{dl}$ can be tailored through the free ion concentration and dielectric constant of the MIEC. Thus, through choice of material, it is possible to engineer the capacitances, and hence potential drops, within devices based on MIECs. This type of control ultimately provides control over charge injection processes and hence a basis for the design of efficient electronic devices.

In single-layer PLECs, the potential drops at the electrodes are balanced at low applied biases, but depending on the MIEC and electrodes, the rates of hole and electron injection may not be. These rates do not necessarily depend on electric field in precisely the same manner. Bilayer structures of MIECs, on the other hand, allow electron and hole injection rates to be balanced through double layer capacitance engineering.

Figure 1:
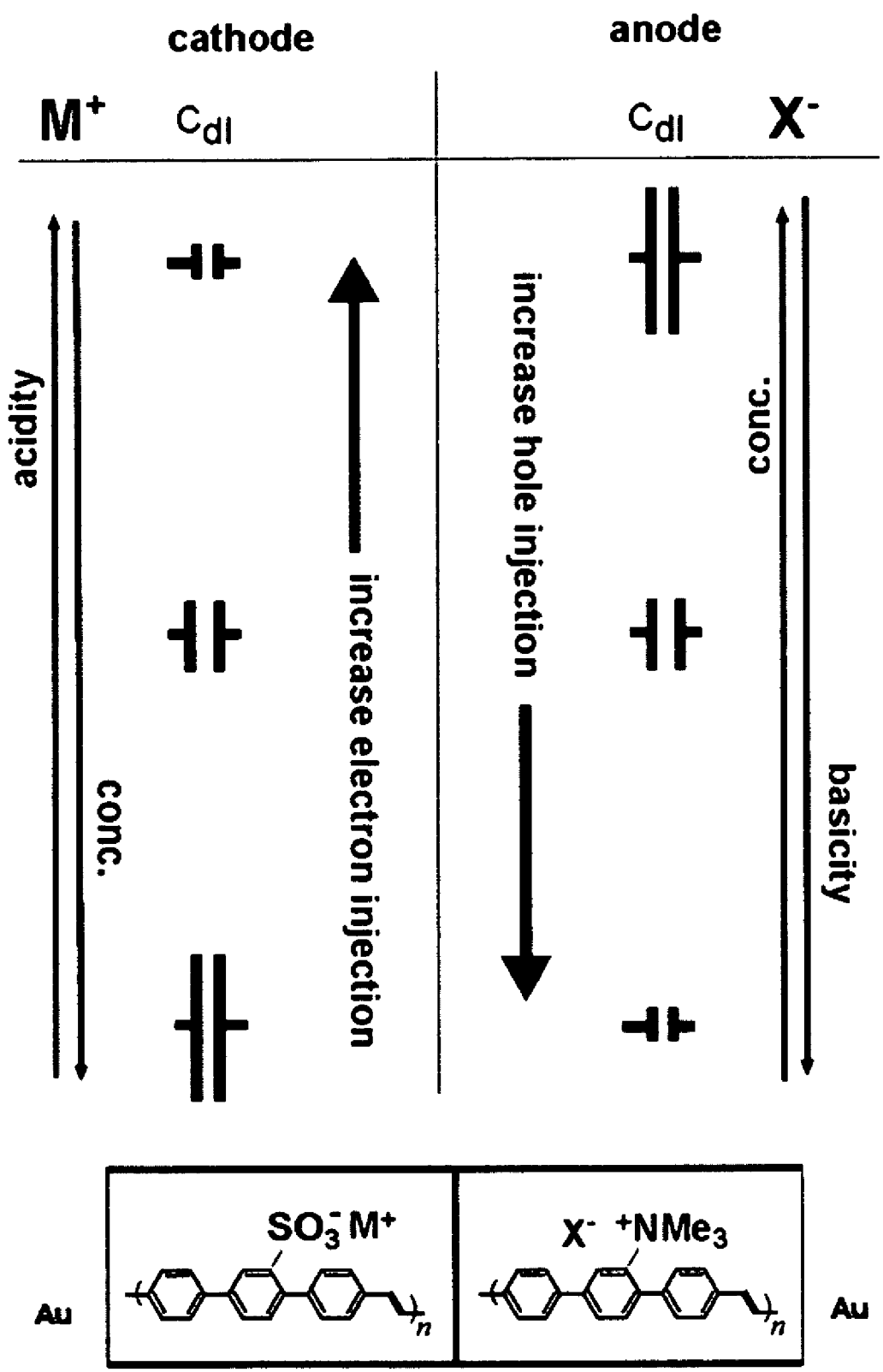
FIG. 1 illustrates a double layer capacitance engineering balancing process for a heteroionic junction according to an embodiment of the invention.

FIG. 1 illustrates this balancing process for a heteroionic junction between a poly(terphenylene vinylene) anionomer and a poly(terphenylene vinylene) cationomer. Decreasing the concentration or acidity of the cation in the anionic material contacting the cathode decreases $C_{dl}$ at this interface and hence decreases the fraction of the applied bias driving electron injection. Similarly, decreasing the concentration or basicity of the anion in the cationic material contacting the anode decreases $C_{dl}$ at this interface and hence the fraction of the applied bias driving hole injection. Variation of these ion populations hence permits for balancing electron vs. hole injection rates for optimal light emission efficiency.

According to eq. (1), one may engineer $C_{dl}$ through the free ion content. This implicates the use of MIECs with varying ion activity. The active layers may be single-ion conductors, e.g., one sign of ion that is immobile and the other mobile so that differentials in salt concentration between phases can be supported. At least one of the active layers must also be luminescent.

FIG. 5 is a schematic illustration of a device according to an embodiment of the invention. Layers 500 and 502 are in contact and sandwiched between electrode layers 504 and 506. First and second layers 500 and 502 are composed of first and second mixed ionic/electronic conducting materials, respectively, both of which are single ion conductors. At least one of the materials is electroluminescent, e.g., the material composing first layer 500. The electrodes are both ion-blocking electrodes, i.e., they are electrically conductive but not ionically conductive.

Figure 2:
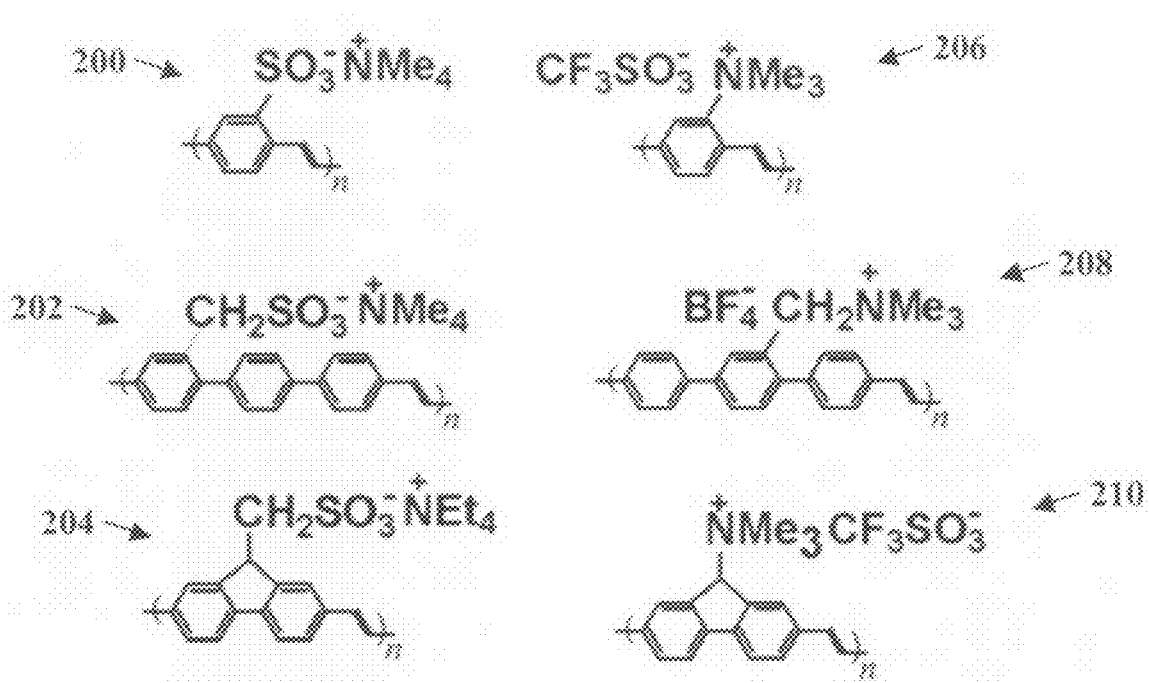
FIG. 2 shows examples of several luminescent conjugated ionomers that may be used for heteroionic junction polymer light emitting electrochemical cells according to the present invention.
Figure 3:
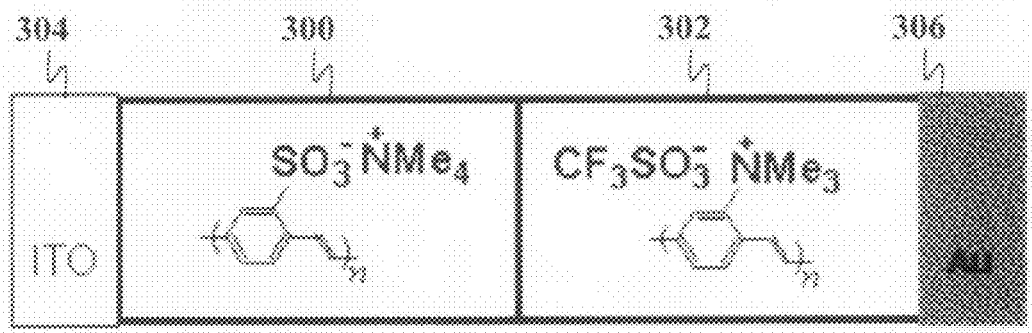
FIG. 3 shows a schematic of a heteroionic junction light emitting electrochemical cell based on poly(phenylene vinylene) in which the ionic functional groups of the conjugated polymers composing the active layers have opposite charges, according to an embodiment of the present invention.

One example of a suitable material is an ionically functionalized conjugated polymer, also known as conjugated ionomer or conjugated polyelectrolyte. In this class of luminescent materials, one of the ions is covalently attached to the polymer backbone and hence rendered immobile. FIG. 2 shows examples of several luminescent conjugated ionomers that could be used for heteroionic junction polymer light emitting electrochemical cells according to the present invention. The specific polymers shown are: 200, 202, 204, 206, 208, and 210. Polymers 200 and 206 are ionically functionalized poly(phenylene vinylenes). Polymers 202 and 208 are ionically functionalized poly(terphenylene vinylenes). Polymers 204 and 210 are ionically functionalized poly(fluorene vinylenes). A device using this type of material according to an embodiment of the invention is shown in FIG. 6. First and second active layers 600 and 602 forming a heteroionic junction are sandwiched between ion-blocking electrodes 604 and 606. Layers 600 and 602 are composed of first and second conjugated ionomers having distinct ionic functional groups. In particular, the ionic functional groups of the first and second conjugated ionomers have opposite electric charges. As an example, FIG. 3 shows a schematic of one specific heteroionic junction light emitting electrochemical cell of this type based on poly(phenylene vinylene). A layer of an anionic poly(phenylene vinylene) 300 is interfaced to a cationic poly (phenylene vinylene) 302. This two-layer structure is then contacted with two conductive electrodes 304 and 306, at least one of which is transparent or semi-transparent to accommodate light emission. In the figure, electrode 304 is transparent ITO while electrode 306 is gold. Through chemical synthesis and ion exchange, the nature and type of ions in active layers 300 and 302 can be changed to separately control electron and hole injection and thereby tune the efficiency of the device.

Figure 4:
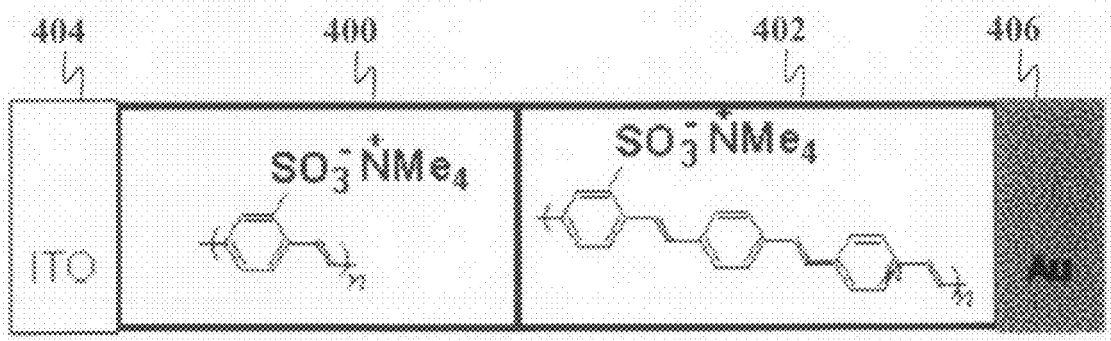
FIG. 4 shows a schematic of a heteroionic junction light emitting electrochemical cell based on poly(phenylene vinylene) in which the ionic functional groups of the conjugated polymers composing the active layers have the same charge but different ion charge densities, according to an embodiment of the present invention.

Alternatively, the ionic functional groups of the conjugated polymers composing the active layers may have the same charge but different ion charge densities, as shown in FIG. 7. In this embodiment, active layers 700 and 702 forming a heteroionic junction are sandwiched between ion-blocking electrodes 704 and 706. Layer 700 and 702 are composed of first and second conjugated ionomers having distinct ionic functional groups with the same charge but different ion charge densities. As an example of this type of device, FIG. 4 shows a schematic of a heteroionic junction light emitting electrochemical cell based on luminescent conjugated ionomers with different ion densities. Active layers 400 and 402 forming a heteroionic junction are sandwiched between ITO electrode 404 and gold electrode 406. Layers 400 and 402 are composed of conjugated ionomers with similarly charged functional groups and based on the poly(phenylene vinylene) backbone. In general, the functional groups may be identical or distinct but with the same charge. The polymer backbones are distinct. The control of ion density is realized through chemical synthesis, e.g., through copolymerization of appropriate monomers. In contrast to the embodiments shown in FIGS. 3 and 6, the sign of the mobile charge in both layers is the same. This emphasizes that the central design rule is control of ion activity, not charge type.

Another class of materials which may be used in the active layers are nonionically functionalized conjugated polymers blended with non-conjugated polyelectrolytes. In these embodiments, one of the ions of the polyelectrolyte is sufficiently large so as not to diffuse or migrate under an applied bias. The key design feature in both cases is rendering one of the ions immobile, and consequently, proper attention need be paid to molecular weight, glass transition temperature, and other factors influencing ion transport. For example, FIG. 8 schematically illustrates a device in which active layers 800 and 802 forming a heteroionic junction are sandwiched between ion-blocking electrodes 804 and 806. Active layers 800 and 802 are each composed of a nonionically functionalized conjugated polymer and non-conjugated polyelectrolyte. The non-conjugated polyelectrolytes in the two layers 800 and 802 are oppositely charged. An example of a suitable non-conjugated anionically functionalized polymer is poly(styrene sulfonate). An example of a non-conjugated cationically functionalized polymer is poly(1,1-dimethyl-3,4-dimethylene piperidinium.

Device Fabrication

Figure 9:
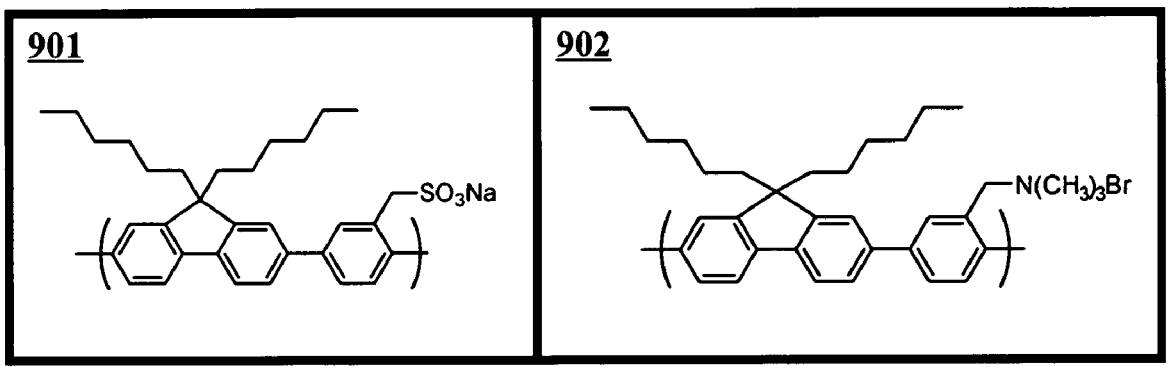
FIG. 9 is a schematic of a heteroionic junction according to an embodiment of the present invention.

Heteroionic junction PLECs according to the present invention may be fabricated using various methods. For example, the two polymer layers of the heteroionic junction may be formed by sequential spin-coating to yield high quality two layer devices on the order of 200-500 nm total thickness. Once formed, post deposition ion exchange may be used to influence ion pairing equilibria and tune the device capacitances for optimal performance. For example, the heteroionic junction shown in FIG. 9 can be fabricated in the following way. Polymer 901 is first deposited on to an ITO substrate by spin coating from a methanol solution (approximately 5 mg/mL) to yield a solid polymer film. Polymer 902 is then deposited on top of this film again by spin coating from a chloroform solution (approximately 5 mg/mL). Polymer 901 is not soluble in chloroform and hence it will not be dissolved by deposition of the second polymer layer. The resulting bilayer structure would be dried in vacuum for a period of several hours and transferred to a vacuum evaporation system. A layer of gold would then be thermally evaporated onto the bilayer to form the top electrode and complete the structure.

Materials

Figure 10A:
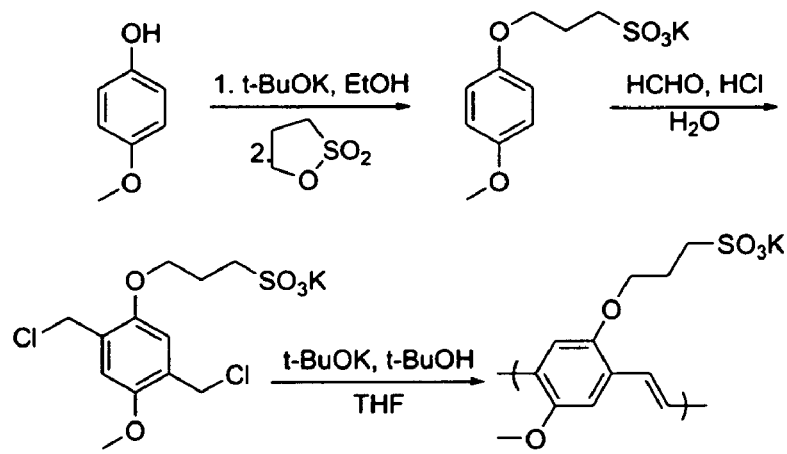
FIGS. 10A-C illustrate the synthesis of ionomers which may be used in embodiments of the present invention.

Heteroionic junction PLECs according to the present invention may use various materials for the active layers, provided they are single ion conductors, i.e., they have one sign of ion that is immobile and the other mobile so that differentials in salt concentration between phases can be supported. Conjugated ionomers satisfy this criterion. The ion that is covalently bound to the polymer backbone is immobile while its companion counter ion is mobile. Conjugated ionomers suitable for use in embodiments of the present invention may be obtained or synthesized using known methods or appropriate adaptations thereof. For example, several types of conjugated ionomers based on poly(arylenes) or poly(arylene vinylene) backbones could be used. One such polymer is commercially available from sigma Aldrich (MPS-PPV), the synthesis of which is shown in FIG. 10A and described in Gu, Z.; Shen, Q-D.; Zhang, J.; Yang, C-Z.; Bao, Y-J, *J App Poly Sci*, 2006, 100, 2930-2936.

Figure 10B:
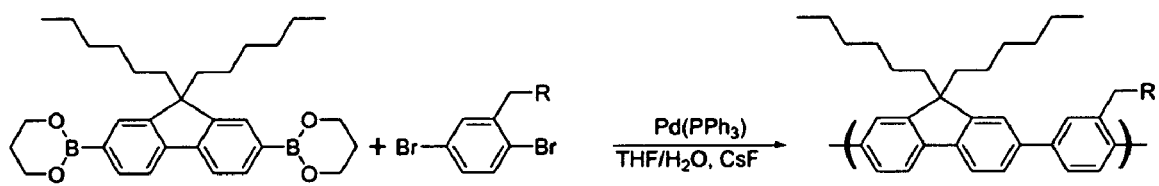

Other suitable polymers based on the poly(arylene) or poly(arylene-vinylene) backbone could be synthesized using standard coupling reactions. For instance, polyfluorene ionomers can be synthesized using an adaptation of a method developed for non-ionically functionalized polyfluorenes (Brookins, R. N.; Schanze, K. S.; Reynolds, J. R., *Macromolecules*, 2007, 40, 3524-3526) as shown in FIG. 10B.

Figure 10C:
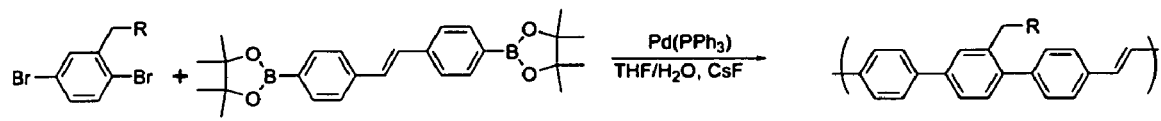

Poly(terphenylenevinylene) ionomers can be similarly synthesized using an adaptation of the method developed for non-ionically functionalized poly(terphenylevinylene) ionomers (Kim, Y-H.; Ahn, J-H,: Shin, D-C.; Kwon, S-K., *Polymer*, 2004, 45, 2525-2532) as shown in FIG. 10C.

In both the poly(fluorene) and poly(terpheyneylevinylene) structures above, the R represents the either anionic or cationic functionality. The necessary monomers can be synthesized according to the following schemes.

Dibromobenzes may be synthesized as shown in FIG. 10D. More specifically, 2,5-dibromotoluene (500 mg, 2.0 mmol) and NBS (534 mg, 3.0 mmol) are added to a round bottom flask to which $CCl_4$ (10 mL) is added. Slurry is brought to reflux and refluxed overnight. Reaction mixture is then washed with copious amounts of water. The organic layer is dried over $MgSO_4$ and filtered. Silica gel (30 g) is added to the organic layer and solvent removed in vacuo. Loaded silica is placed in filter and washed with hexanes until no more material comes through. Solvent is removed and obtained as a white solid.

Alpha,2,5-tribromotoluene (3.29 g, 10.0 mmol) is added to a solution of 1.26 g $Na_2SO_3$ in 40 mL of water. The tribromotoluene does not dissolve in the water but as the water is heated the tribromotoluene melts and forms a puddle on the bottom of the flask. This biphasic mixture is brought to reflux and refluxed for 60 hr. Reaction is not complete but the reaction is removed from heat, stirred and allowed to cool to room temperature. Product is crystallized from the water and separated by filtration while washing with ice cold water and ether.

Alpha,2,5-tribromotoluene (1.0 g, 3.04 mmol) is dissolved in 20 mL ether in round bottom flask with stir bar and septum. 5 mL trimethylamine is placed in separate flask with septum. The two flasks are connected with canula and stirred for three hours. N,N,N-trimethyl-(2,5-bibromobenzyl)ammonium bromide forms as a white precipitate in a few minutes and a large amount of white precipitate is formed at the end of the three hours. The precipitate is washed with ether and dried under vacuum.

Bibromostilbene may be synthesized as shown in FIG. 10E and as described in Kim, Y-H.; Ahn, J-H,; Shin, D-C.; Kwon, S-K., *Polymer*, 2004, 45, 2525-2532.

Boronic ester may be synthesized as shown in FIG. 10F. Specifically, Bis-(4-bromophenyl)-1,2-trans-ethene (1.0 g, 2.95 mmol) is dissolved in dry THF (30 mL) and cooled to −78° C. Using a syringe, 2.5 M n-BuLi (2.48 mL, 6.21 mmol) is added to the suspension. This mixture is allowed to warm to 0° C. over 1 hour. The reaction mixture is again cooled to −78° C., at which point 2-isopropoxy-4,4,5,5-tetramethyl-132-dioxaborolane (2.11 mL, 10.35 mmol) is added by syringe. The reaction mixture is allowed to come to room temperature while stirring overnight. The reaction is then washed with water (2×100 mL) and brine (1×100 mL). The organic layer is dried over $MgSO_4$, filtered, and removed under vacuum. The solids are recrystallized from boiling hexanes to give the product as a white solid.

Ion density in the polymers may be controlled through copolymerization. The specific ionic functional groups are selected based on their electrochemical stability, ability to promote solubility in polar organic solvents, and the desire to introduce minimal electronic influence on the polymer backbone. To achieve faster device response times, blending with polyethers such as so-called amorphous PEO (oxymethylene linked polyethylene oxide) can improve response times. Alternatively, polyether side chains can be incorporated into the polymer.

The invention claimed is:

1. A solid-state light-emitting device comprising:
   a first ion blocking electrode that is electrically conductive but not ionically conductive;
   a second ion blocking electrode that is electrically conductive but not ionically conductive;
   a first active layer composed of a first mixed ionic/electronic conducting material that is a single ion conductor;
   a second active layer composed of a second mixed ionic/electronic conducting material that is a single ion conductor;
   wherein the first active layer is in contact with the second active layer, forming a heteroionic junction;
   wherein the first and second active layers are sandwiched between the first ion blocking electrode and the second ion blocking electrode;
   wherein the first active layer is electroluminescent.

2. The device of claim 1
   wherein the first mixed ionic/electronic conducting material is a first conjugated ionomer.

3. The device of claim 1
   wherein the second mixed ionic/electronic conducting material is a second conjugated ionomer.

4. The device of claim 1
   wherein the first mixed ionic/electronic conducting material is a first conjugated ionomer;
   wherein the second mixed ionic/electronic conducting material is a second conjugated ionomer distinct from the first conjugated ionomer;
   wherein the first conjugated ionomer has a first ionic functional group;
   wherein the second conjugated ionomer has a second ionic functional group distinct from the first ionic functional group.

5. The device of claim 4
   wherein the first ionic functional group and the second ionic functional group have opposite charge signs.

6. The device of claim 4
   wherein the first ionic functional group and the second ionic functional group have equal charge signs;
   wherein the first layer and the second layer have different ion charge densities.

7. The device of claim 1
   wherein the first mixed ionic/electronic conducting material is mixture of a nonionically functionalized conjugated polymer and a non-conjugated polyelectrolyte.

8. The device of claim 1
   wherein the second mixed ionic/electronic conducting material is mixture of a nonionically functionalized conjugated polymer and a non-conjugated polyelectrolyte.

9. The device of claim 1
   wherein the first mixed ionic/electronic conducting material is mixture of a first nonionically functionalized conjugated polymer and a first non-conjugated polyelectrolyte;
   wherein the second mixed ionic/electronic conducting material is mixture of a second nonionically functionalized conjugated polymer and a second non-conjugated polyelectrolyte;
   wherein the first non-conjugated polyelectrolyte and the second non-conjugated polyelectrolyte have opposite charges.

10. The device of claim 1 wherein an electroluminescence of the device is optimal with respect to changes in ion concentrations in the first active layer and the second active layer.

11. The device of claim 1 wherein the first active layer and the second active layer are ionically isolated from each other.

12. The device of claim 1 wherein ions in the first and second active layer do not undergo bulk interdiffusion.

13. The device of claim 1 wherein first ions in the first layer have a first diffusion coefficient, wherein second ions in the second layer have a second diffusion coefficient, and wherein the first diffusion coefficient differs from the second diffusion coefficient by at least an order of magnitude.

* * * * *